(12) United States Patent
Lewis et al.

(10) Patent No.: US 11,462,358 B2
(45) Date of Patent: Oct. 4, 2022

(54) METHOD OF TETRATENITE PRODUCTION AND SYSTEM THEREFOR

(71) Applicant: Northeastern University, Boston, MA (US)

(72) Inventors: Laura H. Lewis, Boston, MA (US); Ian J. McDonald, Weatherly, PA (US); Sahar Keshavarz, Hillsboro, OR (US); R. William McCallum, Santa Fe, NM (US)

( * ) Notice: Subject to any disclaimer, the term of this patent is extended or adjusted under 35 U.S.C. 154(b) by 72 days.

(21) Appl. No.: 16/639,844

(22) PCT Filed: Aug. 20, 2018

(86) PCT No.: PCT/US2018/047092
§ 371 (c)(1),
(2) Date: Feb. 18, 2020

(87) PCT Pub. No.: WO2019/036722
PCT Pub. Date: Feb. 21, 2019

(65) Prior Publication Data
US 2021/0035733 A1 Feb. 4, 2021

Related U.S. Application Data

(60) Provisional application No. 62/547,279, filed on Aug. 18, 2017.

(51) Int. Cl.
*C21D 8/12* (2006.01)
*H01F 1/147* (2006.01)
(Continued)

(52) U.S. Cl.
CPC ............. *H01F 41/00* (2013.01); *C21D 6/001* (2013.01); *C21D 8/1233* (2013.01); *C22C 33/04* (2013.01);
(Continued)

(58) Field of Classification Search
CPC ......... C22C 19/00; C22C 19/03; C22C 30/00; C22C 33/006; C22C 33/02;
(Continued)

(56) References Cited

U.S. PATENT DOCUMENTS 1,978,219 A * 10/1934 Otte ..................... C21D 8/0252
148/108
2,145,712 A * 1/1939 Dahl .................... C21D 8/1233
148/108

(Continued)

FOREIGN PATENT DOCUMENTS

CN 102350504 A 2/2012
CN 106796838 A 5/2017
(Continued)

OTHER PUBLICATIONS

Goldstein, J.I. et al., "Iron meteorites: Crystallization, thermal history, parent bodies, and origin", Chemie der Erde Geochemistry, vol. 69(4):293-325 DOI: 10.1016/j.chemer.2009.01.002, (publication year: 2009).

(Continued)

*Primary Examiner* — Vanessa T. Luk
(74) *Attorney, Agent, or Firm* — Verrill Dana, LLP

(57) ABSTRACT

The invention provides method for making high coercivity magnetic materials based on FeNi alloys having a $L1_0$ phase structure, tetratenite, and provides a system for accelerating production of these materials. The FeNi alloy is made by preparing a melt comprising Fe, Ni, and optionally one or more elements selected from the group consisting of Ti, V, Al, B, C, Mo, Ir, and Nb; cooling the melt and applying extensional stress and a magnetic field. This is followed by heating and cooling to form the L10 structure.

19 Claims, 11 Drawing Sheets

(51) Int. Cl.
*H01F 41/00* (2006.01)
*C21D 6/00* (2006.01)
*C22C 33/04* (2006.01)
*C22C 38/08* (2006.01)
*C22C 38/12* (2006.01)

(52) U.S. Cl.
CPC .............. *C22C 38/08* (2013.01); *C22C 38/12* (2013.01); *H01F 1/14708* (2013.01); *C22C 2202/02* (2013.01)

(58) Field of Classification Search
CPC ............ C22C 33/0257; C22C 33/0278; C22C 33/0285; C22C 33/04; C22C 33/06; C22C 38/06; C22C 38/08; C22C 38/12; C22C 38/14; C22C 2202/02; C21D 1/00; C21D 1/04; C21D 1/26; C21D 1/28; C21D 1/30; C21D 1/32; C21D 1/54; C21D 6/00; C21D 6/001; C21D 6/004; C21D 8/005; C21D 8/12; C21D 8/1216; C21D 8/1222; C21D 8/1227; C21D 8/1233; C21D 8/1238; C21D 8/1244; C21D 8/125; C21D 8/1255; C21D 8/1261; C21D 8/1266; C21D 8/1272; H01F 1/068; H01F 1/08; H01F 1/083; H01F 1/086; H01F 1/14708; H01F 1/14716; H01F 1/14725; H01F 1/14733; H01F 1/14741; H01F 1/1475; H01F 1/14758; H01F 1/15308; H01F 1/16; H01F 1/18; H01F 1/20; H01F 1/22; H01F 1/24; H01F 1/26; H01F 1/28; H01F 41/00
See application file for complete search history.

(56) References Cited

U.S. PATENT DOCUMENTS

| | | | |
|---|---|---|---|
| 2,980,561 A * | 4/1961 | Ford | C21D 9/52 148/245 |
| 3,027,327 A | 3/1962 | Blank | |
| 4,312,684 A | 1/1982 | Chraplyvy et al. | |
| 5,051,856 A | 9/1991 | Narishige et al. | |
| 5,585,196 A | 12/1996 | Inomata et al. | |
| 5,788,782 A | 8/1998 | Kaneko et al. | |
| 6,428,906 B1 | 8/2002 | Wong et al. | |
| 6,514,358 B1 | 2/2003 | Bartholomeusz et al. | |
| 6,928,406 B1 | 8/2005 | Ehara et al. | |
| 7,088,247 B2 | 8/2006 | Herzer et al. | |
| 7,473,325 B2 | 1/2009 | Yoshizawa et al. | |
| 7,597,010 B1 * | 10/2009 | Clark | C21D 8/12 73/862.335 |
| 10,332,661 B2 | 6/2019 | Lewis et al. | |
| 2003/0113582 A1 | 6/2003 | Litvinov et al. | |
| 2004/0067154 A1 | 4/2004 | Kanekiyo | |
| 2004/0074336 A1 | 4/2004 | Daimon et al. | |
| 2004/0134565 A1 | 7/2004 | Sun et al. | |
| 2004/0183702 A1 | 9/2004 | Nachtigal et al. | |
| 2004/0265639 A1 | 12/2004 | Hintz et al. | |
| 2005/0129573 A1 | 6/2005 | Gabriel et al. | |
| 2006/0055392 A1 | 3/2006 | Passmore et al. | |
| 2006/0225535 A1 | 10/2006 | Mainwaring | |
| 2007/0114138 A1 | 5/2007 | Krasteva et al. | |
| 2007/0196428 A1 | 8/2007 | Glauser et al. | |
| 2008/0129437 A1 * | 6/2008 | Yoshizawa | C22C 38/10 336/220 |
| 2008/0187604 A1 | 8/2008 | Tomaselli et al. | |
| 2009/0027149 A1 | 1/2009 | Kocijan | |
| 2009/0101501 A1 | 4/2009 | Tao et al. | |
| 2009/0178921 A1 | 7/2009 | Lawrence et al. | |
| 2009/0242826 A1 | 10/2009 | Harada et al. | |
| 2010/0022045 A1 | 1/2010 | Segal et al. | |
| 2010/0089772 A1 | 4/2010 | Deshusses et al. | |
| 2010/0180667 A1 | 7/2010 | Bender et al. | |
| 2010/0183844 A1 | 7/2010 | Xiong et al. | |
| 2010/0054981 A1 | 9/2010 | Liu | |
| 2010/0218858 A1 | 9/2010 | Baker et al. | |
| 2014/0210024 A1 | 7/2014 | Lin | |
| 2014/0210581 A1 | 7/2014 | Lewis et al. | |
| 2014/0271324 A1 | 9/2014 | Pinkerton | |
| 2015/0155471 A1 | 6/2015 | Furukawa et al. | |

FOREIGN PATENT DOCUMENTS

| | | | |
|---|---|---|---|
| EP | 1895294 A1 | 3/2008 | |
| GB | 400395 A * | 10/1933 | ........... C21D 8/1272 |
| JP | 59127226 | 7/1984 | |
| JP | 2014-105376 A | 6/2014 | |
| JP | 2017512754 A | 5/2017 | |
| WO | 2011055298 A1 | 5/2011 | |
| WO | 2012141205 A2 | 10/2012 | |
| WO | 2013/010173 A1 | 1/2013 | |
| WO | 2016036856 A1 | 3/2016 | |

OTHER PUBLICATIONS

Cahn J. Magnetic Aging of Spinodal Alloys. Journal of Applied Physics, vol. 34, Issue 12, p. 3581-3586 (1963).
Marin P et al. Enhanced magnetic properties of FeCo ribbons nanocrystallized in magnetic field. Applied Physics Letters 94 (12), 122507 (2009).
Mendelsohn L et al. Permanent-Magnet Properties of Elongated Single-Domain Iron Particles. Journal of Applied Physics 26(10):1274-1280 (1955).
Luborsky F et al. Reproducing the Properties of Alnico Permanent Magnet Alloys with Elongated Single-Domain Cobalt-Iron Particles. Journal of Applied Physics 28(3):1344-351 (1957).
Valiev R et al. "Bulk nanostructured materials from severe plastic deformation." Progress in materials science 45 (2000) pp. 103-189.
Azushima A et al. "Severe plastic deformation (SPD) processes for metals." CIRP Annals-Manufacturing Technology 57 (2008), pp. 716-735.
Albertsen J "Tetragonal lattice of tetrataenite (ordered Fe—Ni, 50-50) from 4 meteorites." Physica Scripta 23, pp. 301-306 (1981).
L.H. Lewis, et al., "Inspired by nature: investigating tetrataenite for permanent magnet applications", Journal of Physics: Condensed Matter, Jan. 27, 2014, vol. 26, No. 6, 10 pgs.
P. Manchanda, et al., "Transition-metal and metalloid substitutions in L10-ordered FeNi", Journal of Applied Physics, May 7, 2014, vol. 115, No. 17, 3 pgs.
Swartzendruber, L.J., et al., "The Fe—Ni (Iron-Nickel) System", National Institute of Standards and Technology, Journal of Phase Equilibria vol. 12, No. 3 1991, p. 288-312.
Bekyarova, E. et al., "Mechanism of Ammonia Detection by Chemically Functionalized Single-Walled Carbon Nanotubes: In Situ Electrical and Optical Study of Gas Analyte Detection", Journal of the American Chemical Society, vol. 127, No. 35, Aug. 15, 2007, pp. 10700-10706.
Nosrat Izadi, et al., "Hydrogen Sulfide Sensing Properties of Multi Walled Carbon Nanotubes", Ceramics International, vol. 38, No. 1, Jun. 24, 2011, pp. 65-75.

* cited by examiner

Edge of Sample　　　　　　Centre of Sample

METHOD OF TETRATENITE PRODUCTION AND SYSTEM THEREFOR

STATEMENT REGARDING FEDERALLY SPONSORED RESEARCH OR DEVELOPMENT

This invention was made with government support under grant numbers 1129433, 1259736, and 1601895 awarded by the National Science Foundation and grant number N00014-10-1-0553 awarded by the US Office of Naval Research. The government has certain rights in the invention.

BACKGROUND

Rare-earth magnets have transformed many devices used in modern life while making new inventions possible. Rare-earth magnets, requiring less space than conventional magnets, provide superior magnetic fields and high resistance to being demagnetized, enabling modern devices to be made smaller, more durable, and more efficient. These magnets have become key parts in motors and generators placed in hybrid and electric vehicles, appliances, and toys. However, rare-earth materials are in short supply and have a high cost, so introduction of new technologies to replace rare earth magnets is appropriate and timely.

The composition of FeNi, as an alternative, would not require rare-earth materials as the main component. Equiatomic FeNi with a chemically ordered tetragonal structure, known as tetratenite, is found naturally in some meteorites subjected to extraordinarily long cooling periods and has been confirmed to exhibit excellent permanent magnetic properties. The long cooling periods required to form tetratenite in nature are not applicable for industrial manufacturing of tetratenite. Importantly, the formation of FeNi in the $L1_0$ crystal structure (tetratenite) has been observed under certain conditions in the laboratory and is confirmed to exhibit high magnetization. It would be advantageous to identify superior conditions for preparing FeNi material having $L1_0$ structure, while accelerating preparation times, so that an alternative to using rare-earth as a major component of high efficiency magnets could be economically developed.

Materials science often relies on the ability to influence the performance of a material or system by altering the crystallographic phase and/or microstructure through various material processing techniques: heat treatment, mechanical deformation, application of stress, etc. These material processing techniques can promote the formation or development of certain features such as phase selection, crystallographic texture or chemical ordering, to name a few. Together, these features directly influence a wide range of mechanical (tensile strength, compressive strength, yield strength), electrical (resistivity), and magnetic (magnetic anisotropy) properties which will, in turn, directly affect the material's performance. In the laboratory, formation of FeNi in the $L1_0$ crystal structure (tetratenite) has been observed after subjecting the alloy to material processing. Development of a system that automates material processing, while accelerating the conversion of FeNi to the $L1_0$ crystal structure (tetratenite), would provide a distinct advantage in consistently achieving the desired crystal structure.

SUMMARY

The present technology includes methods to accelerate the formation of the tetragonal chemically ordered ($L1_0$-type, tetratenite) phase, with superior permanent magnetic properties, of FeNi and some alloys of FeNi. Specifically, using the new technology, the $L1_0$-type phase can be formed in industrially relevant time scales by the application of thermal, extensional stress and magnetic field drivers. In embodiments, the field drivers for optimum phase formation are applied simultaneously. Positive results have been achieved using this method that demonstrate unequivocally attainment of the tetragonal chemically disordered (A6-type, FIG. 1) phase in FeNi that is deduced as a transitional phase. Formation of the tetragonal chemically ordered ($L1_0$-type) phase with superior permanent magnetic properties is demonstrated by sample analysis after the system/method application.

One aspect of the present technology is a method of making a magnetic FeNi alloy material containing $L1_0$ ordered structure. The method includes the steps of: (a) preparing a melt comprising Fe, Ni, and optionally one or more elements selected from the group consisting of Ti, V, Al, B, C, Mo, Ir, and Nb, wherein the atomic ratio of elements in the melt is according to the formula $Fe_{(0.5-a)}Ni_{(0.5-b)}X_{(a+b)}$, wherein X is Ti, V, Al, B, C, Mo, Ir, or Nb, and wherein $0 \leq (a+b) \leq 0.1$; (b) cooling the melt to yield a solid form of an FeNi alloy material; (c) subjecting the solid form to a severe plastic deformation process comprising deforming the solid form in a longitudinal direction, wherein the severe plastic deformation process is performed at a first temperature, below a chemical ordering temperature of said $L1_0$ phase, to yield a deformed solid form of said FeNi alloy; (d) applying an extensional stress to the deformed solid form along said longitudinal direction; (e) applying a magnetic field to the deformed solid form along said longitudinal direction; (f) heating the deformed solid form in a reduced oxygen environment to a second temperature, above said chemical ordering temperature; and (g) cooling the solid form from said second temperature to a third temperature, below said chemical ordering temperature, whereby the magnetic FeNi alloy material containing $L1_0$ ordered structure is obtained.

Another aspect of the technology is a system for conditioning a sample with the application of extensional stress, magnetic field, and temperature. The system includes: (a) a vertical tube furnace comprising a vertically oriented sealed sample tube, a thermocouple disposed within the sample tube, and a sample suspension fixture disposed within the sample tube; (b) one or more weights configured for attachment to a sample in the sample tube for applying extensional stress to the sample; (c) one or more permanent magnets configured for attachment to the sample; and (d) a programmable thermostat capable of maintaining a set temperature inside the sample tube by controlling the vertical tube furnace.

Yet another aspect of the invention is a method of annealing or conditioning a sample by applying extensional or compressive stress, a magnetic field, and/or heat. The method includes the steps of: (a) placing a sample inside the sample tube of the system described above, and (b) applying one or more of extensional or compressive stress, a magnetic field, and heat to the sample, whereby the sample is annealed or conditioned.

The technology described herein provides methods and a system that accelerate formation of tetratenite by controlling processing variables applied to the composition of FeNi alloy material. Formation of tetratenite is achieved by using a sample containment tube design within a furnace that allows for the simultaneous or intermittent programming, control, and application of material processing variables such as atmosphere, temperature, extensional or compressive stress and magnetic field—to direct the accelerated development of microstructural changes. This system can include the following features:

Passive, but strong and durable, magnetic field design that allows for long-term (hours to years) anneals.

The magnetic field design requires only enough permanent magnet material to saturate the material being processed.

Extensional or compressive stress may be applied by a variety of techniques, some of which include static weight and hydraulic force.

The closed-loop magnetic field configuration eliminates the energy required to support a magnetic field outside of the material. (In other words, it eliminates the "air gap" that severely reduces the available magnetic flux to influence the atomic and magnetic domain aspects of the material during processing).

Eliminates the effects of a demagnetizing factor that occurs in all existing magnetic annealing apparatus to date. This aspect reduces the coercivity requirement for the permanent magnet that provides the static field.

The energy consumption during annealing is reduced to that required only for the annealing furnace. This makes long term anneals at relatively low temperatures economically acceptable and appropriate for industrial application.

The present technology is further summarized by the following list of embodiments:

1. A method of making a magnetic FeNi alloy material containing $L1_0$ ordered structure, the method comprising the steps of:
   (a) preparing a melt comprising Fe, Ni, and optionally one or more elements selected from the group consisting of Ti, V, Al, B, C, Mo, Ir, and Nb, wherein the atomic ratio of elements in the melt is according to the formula $Fe_{(0.5-a)}Ni_{(0.5-b)}X_{(a+b)}$, wherein X is Ti, V, Al, B, C, Mo, Ir, or Nb, and wherein $0 \leq (a+b) \leq 0.1$;
   (b) cooling the melt to yield a solid form of an FeNi alloy material;
   (c) subjecting the solid form to a severe plastic deformation process comprising deforming the solid form in a longitudinal direction, wherein the severe plastic deformation process is performed at a first temperature, below a chemical ordering temperature of said $L1_0$ phase, to yield a deformed solid form of said FeNi alloy;
   (d) applying an extensional stress to the deformed solid form along said longitudinal direction;
   (e) applying a magnetic field to the deformed solid form along said longitudinal direction;
   (f) heating the deformed solid form in a reduced oxygen environment to a second temperature, above said chemical ordering temperature; and
   (g) cooling the solid form from said second temperature to a third temperature, below said chemical ordering temperature, whereby the magnetic FeNi alloy material containing $L1_0$ ordered structure is obtained.
2. The method of embodiment 1, wherein step (d) and/or step (e) is performed during at least part of the time while performing step (g).
3. The method of embodiment 2, wherein steps (d) and (e) are performed simultaneously, sequentially, or intermittently at least part of the time while performing step (g).
4. The method of any of the preceding embodiments, wherein step (g) comprises cooling the solid form from said second temperature at a rate of about 0.01° C./minute to about 1° C./minute.
5. The method of any of the preceding embodiments, wherein the third temperature is from about 50% to about 90% of said chemical ordering temperature.
6. The method of any of the preceding embodiments, wherein the third temperature is from about 2° C. to about 20° C. below said chemical ordering temperature.
7. The method of any of the preceding embodiments, wherein the severe plastic deformation comprises cold rolling performed at a temperature in the range from about 310° K. to about 600° K.
8. The method of any of the preceding embodiments, wherein the extensional stress applied in step (d) is in the range from about 1 MPa to about 60 MPa.
9. The method of any of the preceding embodiments, wherein the extensional stress is applied in a downward direction by attaching a weight or a tensioned claimp to a lower portion of the deformed solid form.
10. The method of any of the preceding embodiments, wherein the magnetic field applied in step (e) has a magnitude in the range from 0.5 T to 10 T.
11. The method of any of the preceding embodiments, wherein the magnetic field applied in step (e) is applied using a closed loop produced by attaching permanent magnets directly ferromagnetic armatures attached to the deformed solid form and providing a flux return path.
12. The method of embodiments 11, wherein the flux return path establishes flux lines through the deformed solid form in said longitudinal direction.
13. The method of any of the preceding embodiments, wherein step (g) comprises holding the deformed solid form at the third temperature for a period of time in the range from about 4 hours to about one year.
14. The method of any of the preceding embodiments, wherein at least 50% by weight of the magnetic FeNi alloy material is in the form of $L1_0$ ordered structure.
15. The method of any of the preceding embodiments, wherein at least 90% by weight of the magnetic FeNi alloy material is in the form of $L1_0$ ordered structure.
16. The method of any of the preceding embodiments, wherein the magnetic FeNi alloy material is nanoparticulate.
17. The method of any of the preceding embodiments, wherein the magnetic FeNi alloy material is a bulk material.
18. A system for conditioning a sample with the application of extensional stress, magnetic field, and temperature, the system comprising:
   (a) a vertical tube furnace comprising a vertically oriented sealed sample tube, a thermocouple disposed within the sample tube, and a sample suspension fixture disposed within the sample tube;
   (b) one or more weights configured for attachment to a sample in the sample tube for applying extensional stress to the sample;
   (c) one or more permanent magnets configured for attachment to the sample; and
   (d) a programmable thermostat capable of maintaining a set temperature inside the sample tube by controlling the vertical tube furnace.
19. The system of embodiment 18, wherein the sample tube further comprises a gas inlet and a gas outlet for flowing a gas through the sample tube or removing a gas from the sample tube.
20. A method of annealing or conditioning a sample by applying extensional or compressive stress, a magnetic field, and/or heat, the method comprising the steps of:

(a) placing a sample inside the sample tube of the system of claim 18, and (b) applying one or more of extensional or compressive stress, a magnetic field, and heat to the sample, whereby the sample is annealed or conditioned.

21. The method of embodiment 20, wherein both extensional or compressive stress and a magnetic field are applied in the same direction.
22. The method of embodiment 20, wherein the method is performed using a controlled atmosphere inside the sample tube.
23. The method of embodiment 20, wherein said annealing or conditioning alters a crystal structure of the sample.

DETAILED DESCRIPTION

Figure 1:
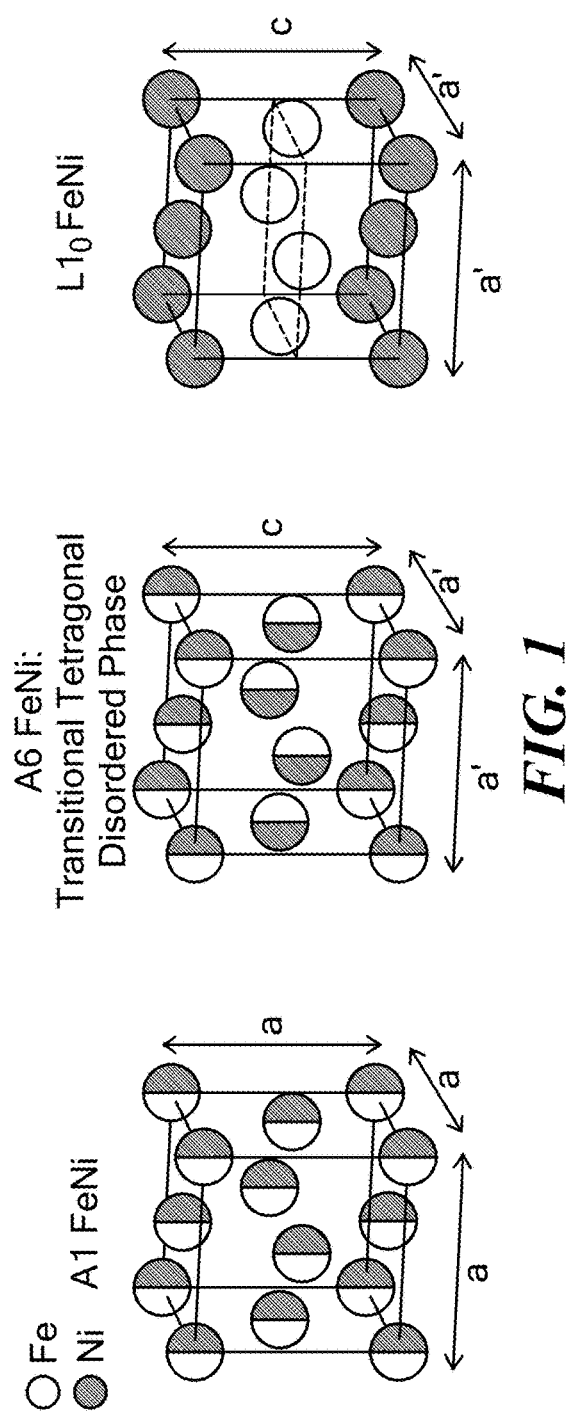
FIG. 1 shows representations of the cubic (A1) unit cell and the tetragonal ($L1_0$) unit cell. The unit cells of the disordered face-centered cubic (fcc, left) and the tetragonal chemically ordered $L1_0$ crystal structures (right). The lattice parameters are identified, and the half-shaded spheres of depiction indicate an equal probability of lattice site occupancy for either Fe or Ni. Both depictions show the same orientation of the basis vectors and a non-standard, C-centered tetragonal unit cell to indicate the $L1_0$ structure, with the primitive unit cell delineated by the dashed black lines.
Figure 2:
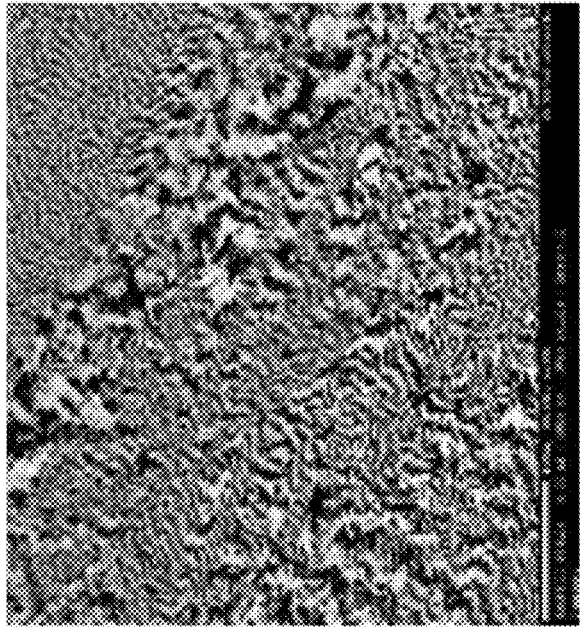
FIG. 2 shows MagnetoOptic Kerr Effect (MOKE) microscopy of FeNi homogenized material, as-solidified state. The image shows a field of approximately 500 microns×500 microns. The meandering magnetic domains are characteristic of a low-anisotropy magnetic phase with a cubic crystal structure.

The present technology provides a system and methods for fabricating an FeNi alloy containing $L1_0$ ordered crystal structure. The present methods and system can be used to accelerate the formation of tetratatenite and arrangement of oriented $L1_0$ variants (i.e., crystallites) to industrially relevant time scales by the application of severe plastic deformation, extensional stress and magnetic field drivers, all applied to the sample in the same longitudinal direction. The present technology accelerates formation of tetratatenite by the application of some or all or the following "drivers": heat, extensional stress, and magnetic field. In preferred embodiments, the three drivers are applied to the sample simultaneously. Application of sequential (not simultaneous) drivers to FeNi-based alloys resulted in a precursor phase that leads to the formation of tetratenite. In particular, annealing FeNi-based samples (e.g., $Fe_{49}Ni_{49}Ti_2$, at %) that were previously subjected to severe plastic deformation produced the precursor phase with the chemically disordered tetragonal (A6) structure. (FIGS. 1, 2).

The present technology includes formation of materials and methods/systems of processing and includes processing of the A6 structure of FeNi alloys to form the $L1_0$ ordered structure. The A6 structure is prepared, in one embodiment, by preparing a molten FiNi alloy and cooling the melt, applying severe plastic deformation (SPD), and annealing. The A6 structure is characterized by less order of the crystal structure, low-anisotropy and meandering magnetic domains as shown in FIG. 2. SPD refers to a family of metal processing techniques that convey a complex stress state or high shear state to a material via the generation of a high density of lattice defects. This type of processing delivers excess energy that is stored in the formation of non-equilibrium defects to cause a permanent change of shape in a material that is related to the breaking and rearrangement of interatomic bonds. SPD allows the generation and motion of crystalline defects that can include 0-dimensional lattice defects, such as lattice vacancies or lattice distortions; 1-dimensional lattice defects, such as lattice dislocations; and 2-dimensional lattice defects, such as crystallite surfaces and grain boundaries. The family of SPD techniques includes, but is not limited to: mechanical milling, mechanical alloying (including cryomilling), rolling (especially cold rolling), accumulative roll bonding, extrusion processes including equal channel angular extrusion, high pressure torsion, and repetitive corrugation and straightening. Preferred SPD methods include cryomilling and cold rolling. In the cryomilling methods (also referred to as cryogenic grinding), a slurry of metal powder is mechanically milled as a slurry in a cryogen, such as liquid nitrogen. In the cold rolling method, the metal sample is passed between one or more pairs of rolls whereupon it is highly reduced in thickness and increased in area, nominally conserving the sample volume. In cold rolling, the temperature of the material is maintained below the recrystallization temperature or chemical ordering temperature of the material.

In the present technology, the application of the magnetic field can be performed before, after, or during the annealing step, or before, during, and after annealing. The conditions for annealing are dependent on the combination of time and temperature. Lower annealing temperature (e.g., ambient temperature) requires a longer period of annealing, such as weeks, months, or even years. Higher annealing temperatures, up to but not exceeding the chemical ordering temperature, will reduce the time required for annealing, such as to days or weeks. The temperature can vary or be held constant during the annealing period. The magnitude of the magnetic field can have a range from 10 G to 100000 G. The magnetic field can be, for example, 10, 1000, 5000, 10000, 20000, 30000, 40000, 50000, 60000, 70000, 80000, 90000, or 100000 G. The magnetic field can be applied in the same direction as other material stressors, or the magnetic field can be applied in other directions. The compound can be in any physical form, such as a powder, composite, nanocomposite, or in solid form. If in powdered form, it can be compressed to form a compact, preferably in the presence of a magnetic field, to form a permanent magnet of any desired size and shape.

Figure 10:
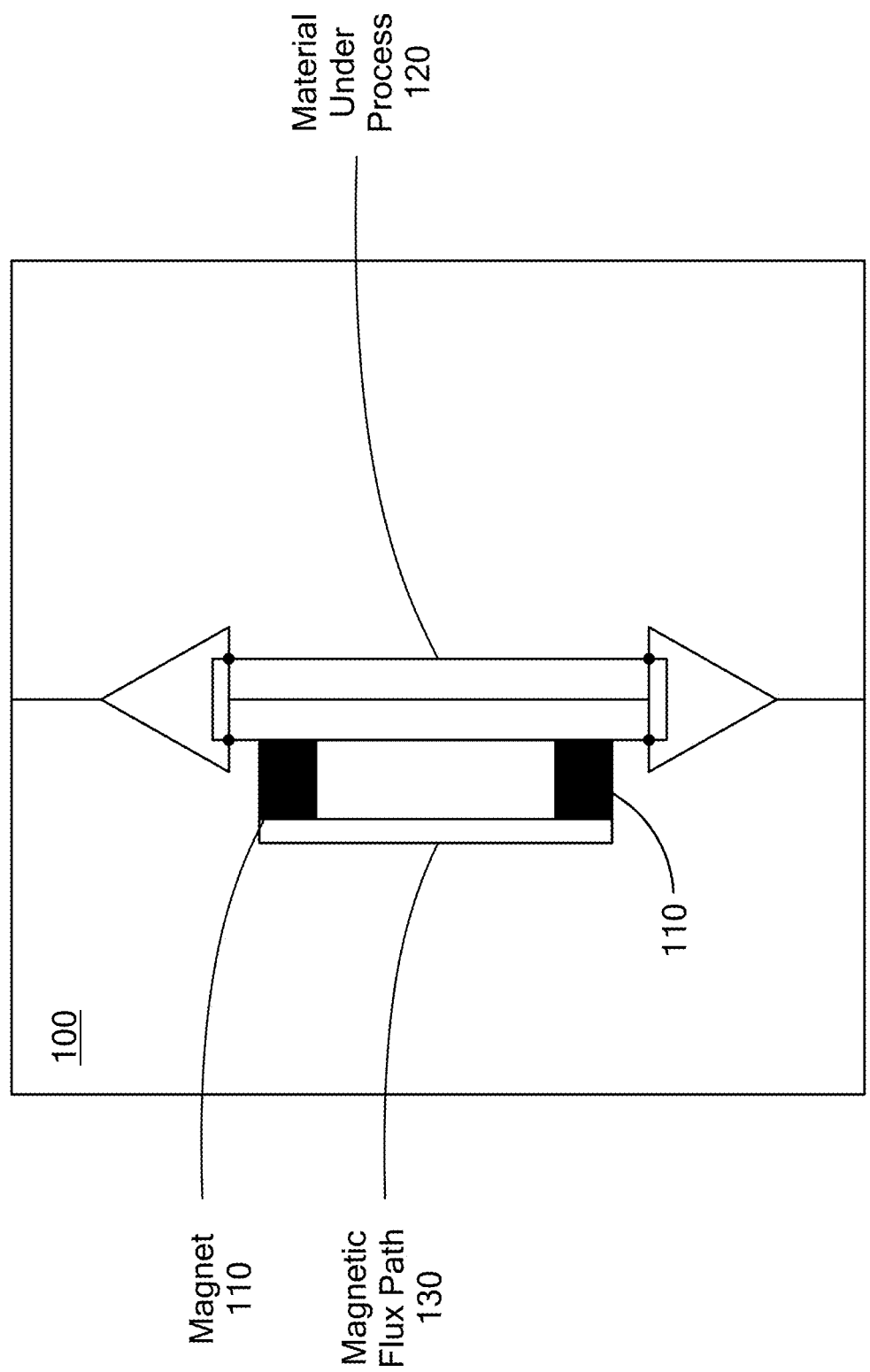
FIG. 10 shows a schematic of the closed magnetic circuit assembly 100 for application of saturating magnetic fields in a specific direction. The attachment of two permanent magnets 110 to the material 120 under process results in magnetic flux which is then directed longitudinally through the material under process after a magnetic flux path 130 is attached to the other sides of the permanent magnets.
Figure 12:
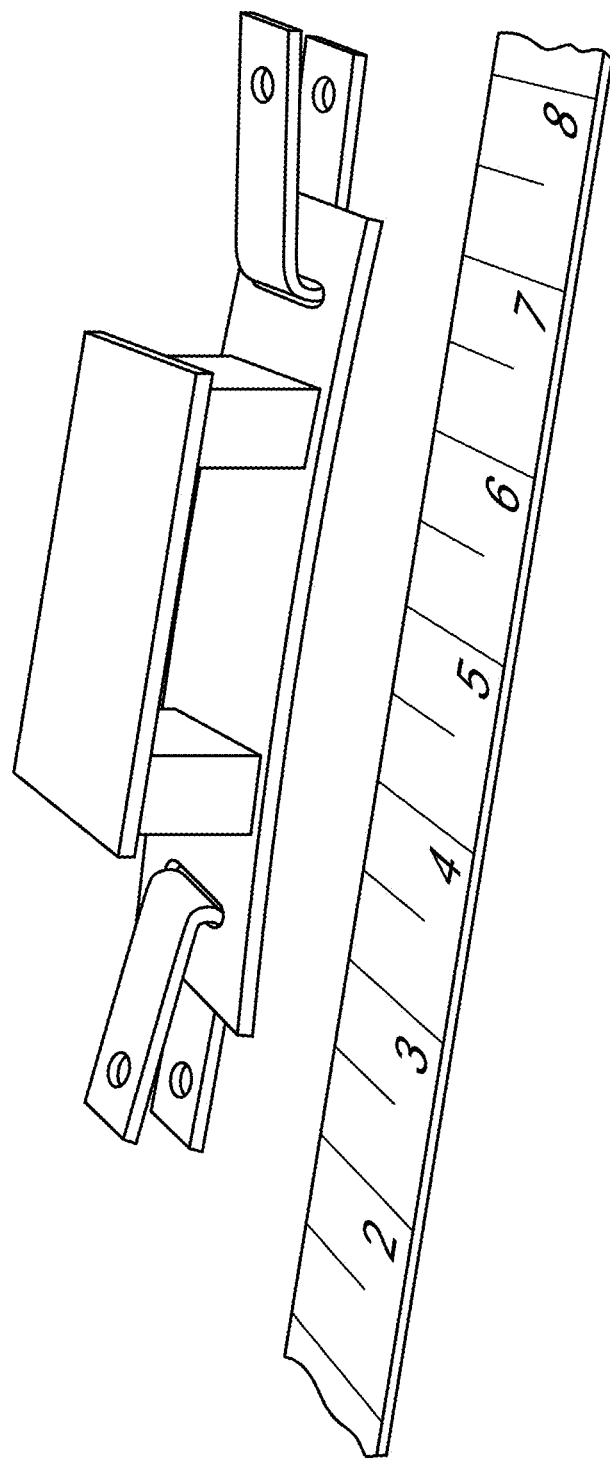
FIG. 12 shows a photograph of the closed magnetic circuit assembly for application of saturating magnetic fields, directionally applied. The sample for conditioning is shown laying down flat with a clip attached to both ends. Two permanent magnets are attached to the sample for conditioning. A magnetic flux return path is attached, connecting the tops of both permanent magnets. The size scale numbering is in centimeters.

When permanent magnets are chosen for application of magnetic field, a saturating magnetic field is applied to the material by attaching two high-temperature permanent magnets directly to the material. The permanent magnets are then connected by a soft Fe or μ-metal flux return path (FIGS. 10, 12). The flux return path creates a closed magnetic circuit, causing the magnetic field to align longitudinally, lengthwise through the sample. This closed magnetic circuit eliminates inefficient magnetic fringing fields by guiding the magnetic field directly through the sample. The maximum operating temperature of the magnets can be chosen based on the desired annealing temperature for the sample. This magnetic circuit set-up is clipped directly onto the samples; the force of attraction between the high-temperature magnets and the sample/flux return path is sufficiently strong to keep the sample(s)-magnet assembly intact and in place.

The technologies can be applied to a bulk form of material. Bulk forms of material include METGLAS and amorphous metal/metal alloys formed by various methods including but not limited to rapid cooling. A bulk form is defined as an amorphous solid, glass, crystalline solid, metallic solid, or any solid containing varying degrees of amorphous content, crystalline content, or transitions between these states within. A bulk form, when composed partially or wholly of numerous particles, has particle sizes larger than the micrometer range. In contrast, nanoparticulate material is defined as having particle sizes below 10 microns. Material can be composed of mixtures of nanoparticulate material and bulk form.

Figure 3:
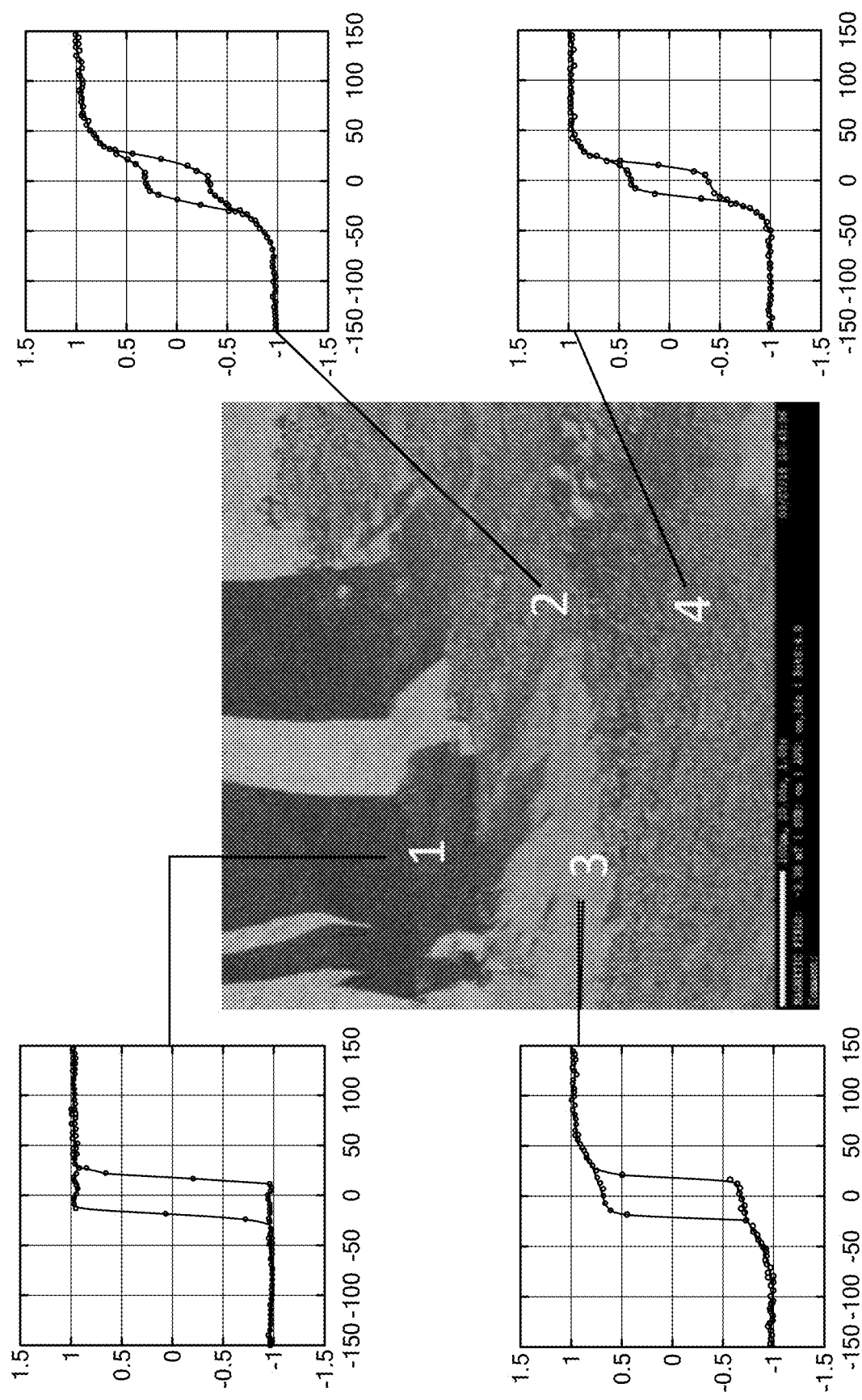
FIG. 3 shows MOKE microscopy of the same material presented in FIG. 2, after multidriver processing. The image shows a field of approximately 500 microns×500 microns. Regions 2 and 4 are characteristic of a low-anisotropy magnetic phase with a cubic crystal structure; Region 3 contains a mixture of uniaxial and cubic anisotropy, while Region 1 has uniaxial anisotropy. Site-specific hysteresis loops shown from Regions 1-4 in the sample indicate the hysteresis loop measured from Region 1 is very square, while those from Regions 2 and 4 indicate characteristic perminvar behavior; the hysteresis loop measured from Region 3 is a combination of the two types of hysteresis loops of Region 1 and Regions 2-4.
Figure 4:
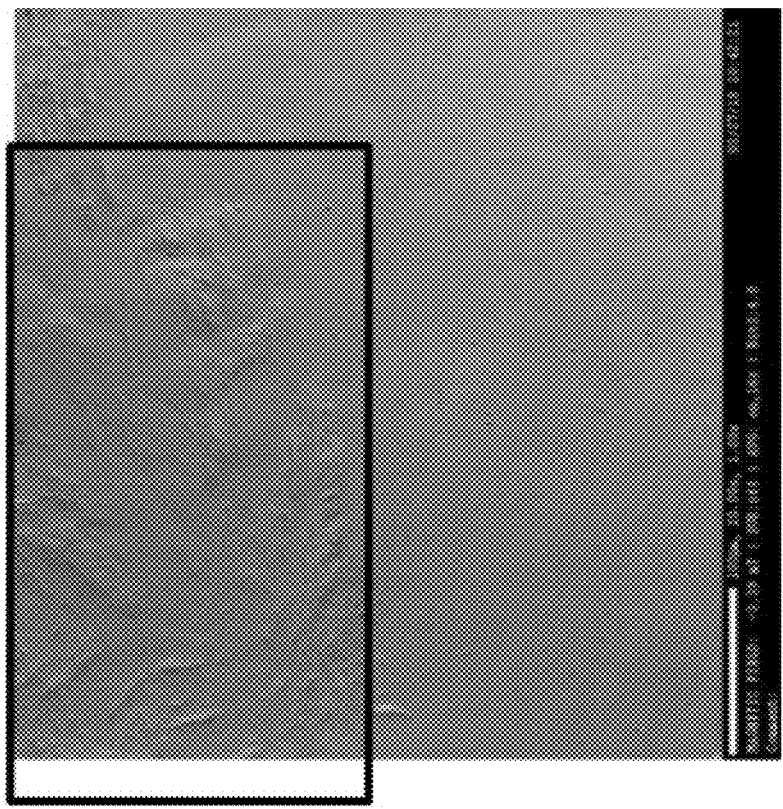
FIG. 4 shows MOKE microscopy of the same material presented in FIG. 2, after multidriver processing (left side); compared with a topographic image (right side) of the same material after multidriver processing. The images represent approximately 500 microns×500 microns. The box indicated on the right-hand topographic image indicates a region of elevated mechanical hardness, associated with the magnetically uniaxial region, which is indicated by a box on the left-hand MOKE image.
Figure 4:
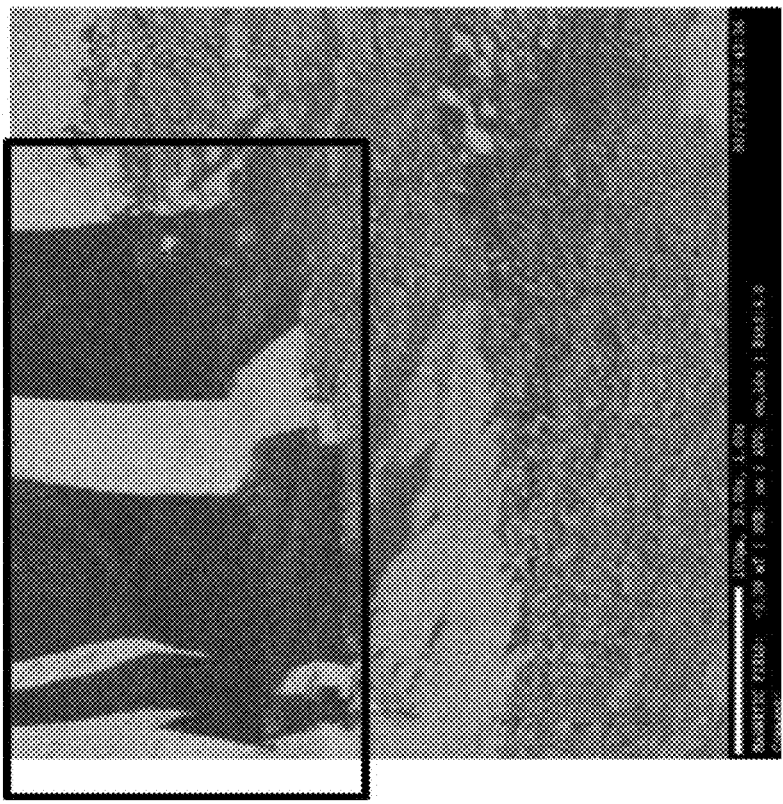

Application of the technologies described herein causes large changes in magnetic property as tetratenite is formed. The A6 structure of FeNi in presented in FIG. 2 was examined using MagnetoOptic Kerr Effect (MOKE) microscopy before application of simultaneous drivers to produce the $L1_0$ ordered structure. In FIG. 3 the same sample presented in FIG. 2 is analyzed, after application of multi-driver processing, using MOKE microscopy and using site-specific hysteresis loops. Comparing FIG. 3 to FIG. 2, the MOKE microscopy imaging shows significant changes in the anisotropy of the sample. The meandering magnetic domains seen in FIG. 2 are not seen in the upper left corner of FIG. 3 indicated as Region 1. In FIG. 4, the MOKE microscopy image of the same material is paired next to topographical imaging of the same sample. The topographical imaging indicates changes in topography in the same area Region 1. The change in magnetic property of the material is due to change in crystal structure caused by the presently described technology, and the change is topography is observed as crystal structure/density has changed. High-energy synchrotron X-ray diffraction data provides additional evidence of the existence of a new crystal structure in the multidriver-processed samples [Ref 5]. It is typical that chemically ordered forms of materials, such those with the $L1_0$ structure, possess a more efficient packing density, and hence a smaller unit cell volume, than the chemically disordered (A1-type) counterparts. This trend is found in the X-ray diffraction data on the FeNi alloys of this disclosure. Shown below, Table 1 presents data derived from analysis (Reitveld refinement) of Bragg peaks measured from 3 separate locations during X-ray diffraction experiments, using a cubic model for convenience. It is noted that there is a consistent decrease in the unit cell volume upon multidriver processing, producing a structure of a higher density that signals the chemically ordered phase.

TABLE 1

| Sample | Lattice parameter | Unit cell volume $V(Å^3)$ | % volume change |
| --- | --- | --- | --- |
| FeNiMo- as-cast, homogenized | 3.60403 Å | 46.81 | 0 |
| FeNiMo - multidriver processed (location 1) | 3.59274 Å | 46.37 | −0.94 |
| FeNiMo - multidriver processed (location 2) | 3.59841 Å | 46.59 | −0.47 |
| FeNiMo - multidriver processed (location 3) | 3.59769 Å | 46.57 | −0.51 |

The change in density is significant because it is known from the meteoritic literature that the formation of $L1_0$ phase (tetratatenite) always resides in mechanically harder locations in the meteorite sample (Goldstein, J. I., Scott, E. R. D., & Chabot, N. L. (2009). "Iron meteorites: Crystallization, thermal history, parent bodies, and origin" Chemie der Erde-Geochemistry, 69(4), 293-325). Overall, these data confirm that multidriver processing produces uniaxial anisotropy, consistent with the A6 and $L1_0$ tetragonal crystal structures.

EXAMPLE

Figure 8:
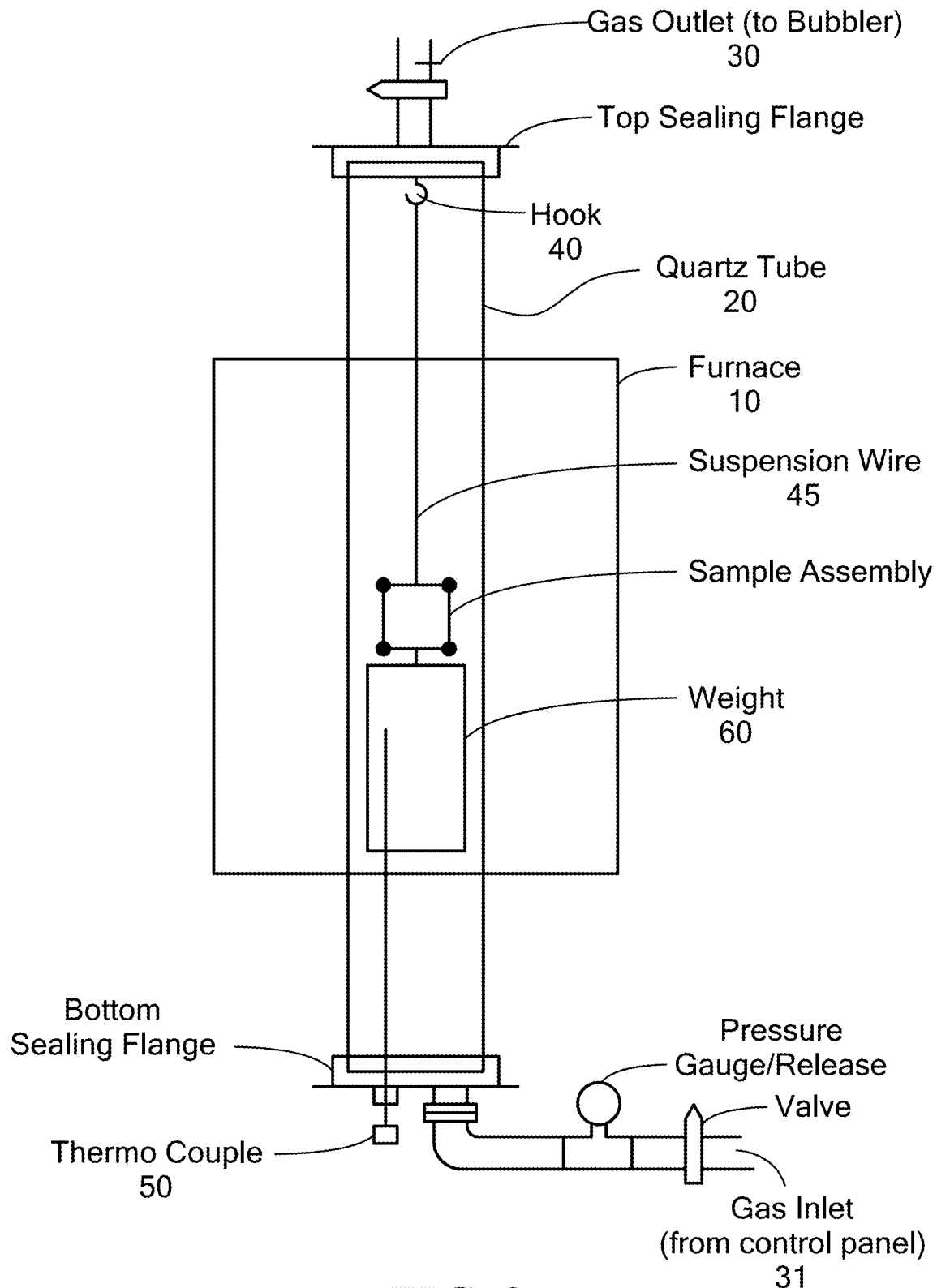
FIG. 8 shows a schematic of the vertical furnace tube 10 with contained sealed sample tube assembly 20, a quartz tube, sealed at both ends with a flange. The top sealing flange includes a gas port 30 and hook 40 for attachment of a suspension wire 45. The bottom sealing flange includes a gas port 31 and passage of a thermo-couple 50. The sample assembly is shown suspended from the top sealing flange, with a weight 60 suspended from the bottom of the sample. A pressure gauge/release is shown connecting to the bottom sealing flange, with a controlling valve separating gas inlet from the control panel.

A system was constructed using a vertical tube furnace equipped with a 2-inch ID quartz sample tube that was sealed on both ends by a set of sealing flanges using a set of silicone O-rings (MTI Corp design) to prevent oxidation and ambient contamination while providing controlled atmosphere. The bottom flange included two ports, one for the insertion of a thermocouple to accurately monitor the real-time temperature and the second for a gas inlet. The top flange also included a gas inlet as well as two small rings that were welded onto the inside surface of the flange for hanging or securing sample(s). These two sealing flanges and gas inlets grant control over the atmosphere in the furnace during annealing. The schematic details of this vertical furnace tube are shown in FIG. 8. As the magnetic field is applied interior to the atmosphere vessel, the vessel may be made of magnetic stainless or other magnetic materials.

Figure 9:
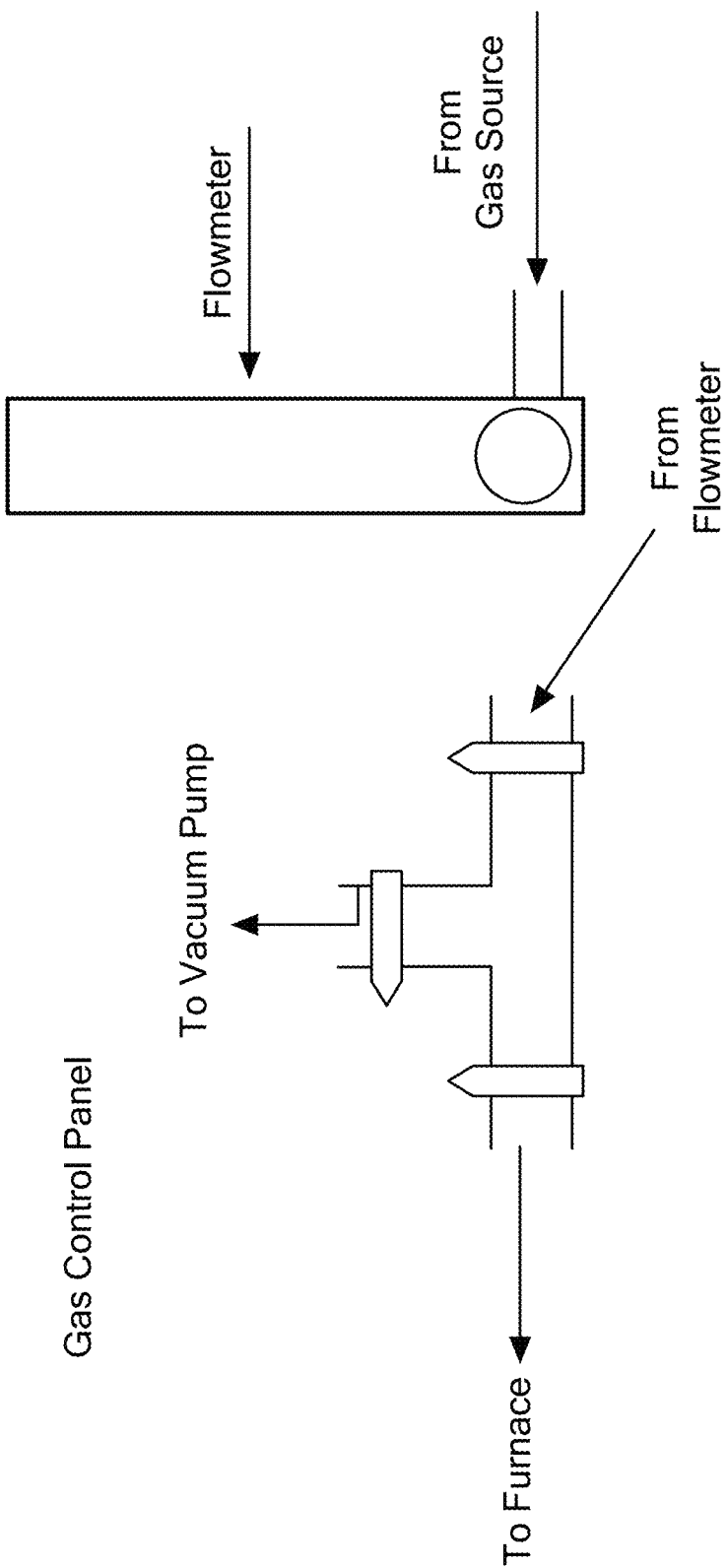
FIG. 9 shows an example schematic of a gas control panel including a flowmeter connected to a gas source, isolation valves enabling the application of vacuum instead of gas, and connection to the bottom flange of the sample tube assembly shown in FIG. 8.
Figure 11:
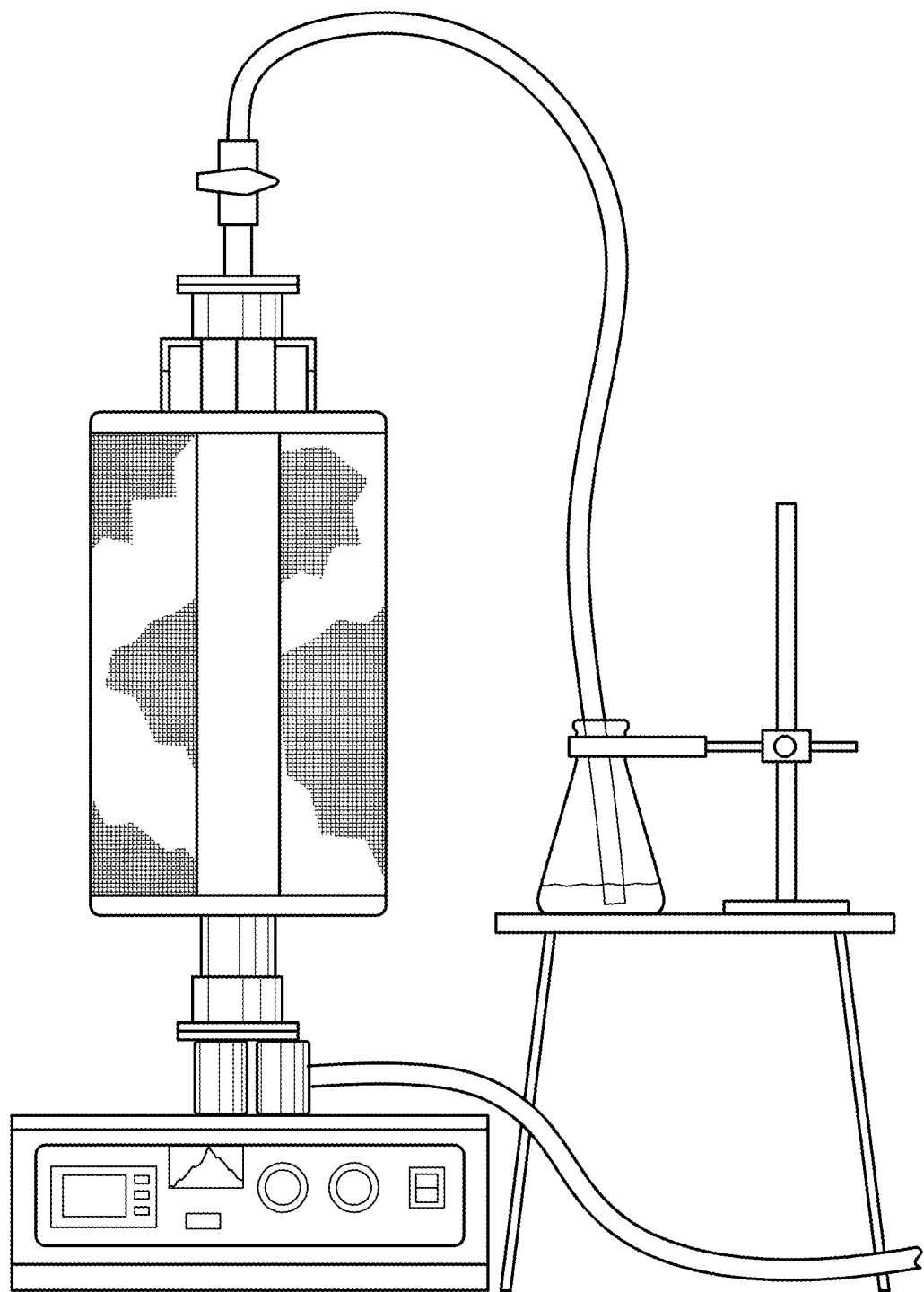
FIG. 11 shows a photograph of the vertical tube furnace with an inert gas bubbler set-up, with gas bubbles directed into the Erlenmeyer flask, which contains typical vacuum pump oil. Near the top center of the photograph, a gas tube is shown connected to a valve at the top gas port (top sealing flange of the sample tube). This gas tube directs gas into the Erlenmeyer flask. The vacuum pump oil helps remove volatiles, oxygen, and other contaminates from the sample environment.

A separate gas control panel is included in the design and connected to the furnace through a series of tubing(s) that provides appropriate flexible connections. For gas connections, rubber tubing is acceptable, but least preferred. Materials known in the art that are thermally and gaseously insensitive and that provide flexibility are preferable. This gas control panel allows for monitoring and controlling the gas flow volume and the atmosphere in the tube furnace through a series of valves as well as the inclusion of a roughing mechanical vacuum pump and a flowmeter, as shown in FIG. 9. A gauge to monitor pressure and a pressure relief valve to limit the pressure in the vessel to a safe level were located immediately preceding the gas connection to the furnace to prevent over pressurization. The tube was sealed by closing the valve attached to the gas inlet on the top sealing flange. After sealing, the vacuum pump was used to pump down the system to ~700 mTorr and subsequently the furnace tube was flushed with an inert gas to remove the oxygen and other volatile gases and byproducts from the sealed quartz tube (the processing chamber). Following this purge, the sample space was sealed under vacuum, static inert gas, or flowing inert or carrier gas(es). The topmost valve was opened slightly and an outlet tube is inserted into a beaker containing typical vacuum pump oil as shown in FIG. 11. This acts as a bubbler, which removes the volatile byproducts, oxygen and other contaminates from the sample(s) environment during the sample(s) processing and meanwhile creates a uniform temperature across the sample(s).

Figure 13:
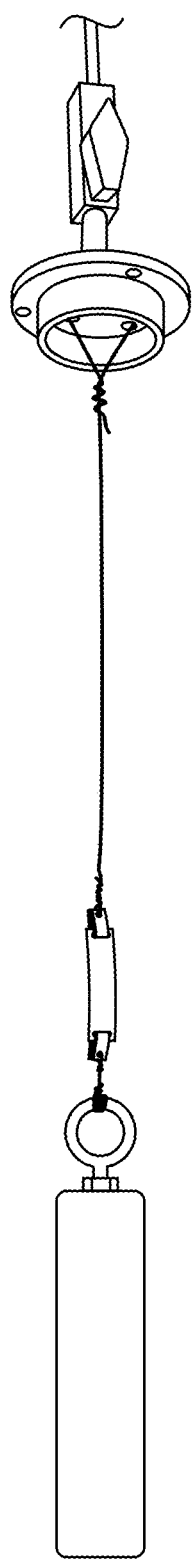
FIG. 13 shows a photograph of application of uniform extensional stress in a specific direction by hanging weight from the sample.
Figure 14:
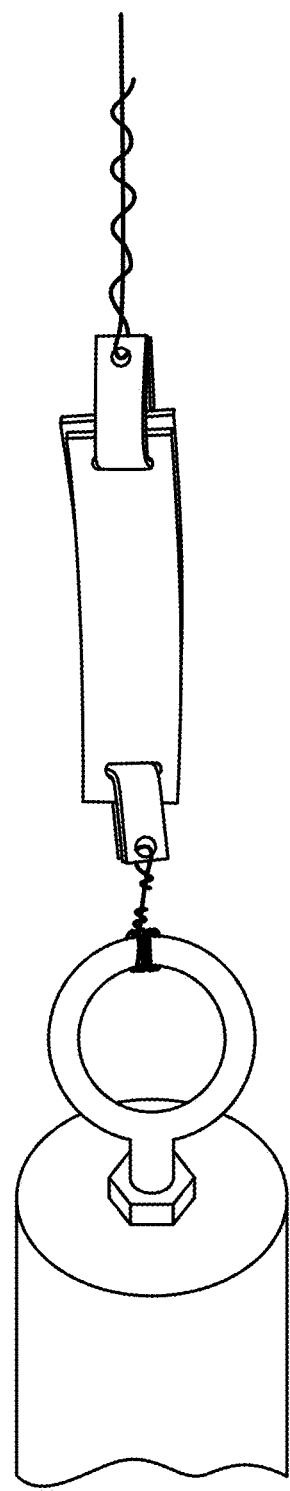
FIG. 14 shows a photograph of application of uniform extensional stress detailing the suspension attachment and weight attachment to the sample.

An extensional stress was administered to the bulk-form material sample by hanging a cylindrical weight from the suspended sample (FIGS. 8, 13). The sample was kept thin in order to experience a large tensile stress in the laboratory-scale scenario. The choice of sample cross-sectional area depends largely on the desired applied stress, the suspended weight and the processing conditions. A set of two horizontal slots were machined into the top and bottom of the sample to allow application of an extensional stress across the sample(s) as shown in FIG. 14. A clip was then used to attach hanging wires to both ends of sample(s); this arrangement evenly distributed weight and provided the option for annealing multiple samples simultaneously. The sample was then hung from the rings welded to the inner surface of the top sealing flange with the weight hung from the bottom of the sample. The sample was positioned such that it hangs at the section of the furnace with the most stable temperature profile (typically near the center of the furnace).

A saturating magnetic field was applied to the material by attaching two high-temperature permanent magnets (e.g., commercial SmCo) that are connected by a soft Fe or μ-metal flux return path (FIG. 12). This closed magnetic circuit eliminates inefficient magnetic fringing fields by guiding the magnetic field directly through the sample. This magnetic circuit set-up was clipped directly onto the samples; the force of attraction between the high-temperature magnets and the sample/flux return path was sufficiently strong to keep the sample(s)-magnet assembly intact and in place. The maximum operating temperature of the magnets was chosen based on the desired annealing temperature. As an example, SmCo magnets can be used for higher temperature applications, up to ~200 degrees lower than their Curie temperature of 800° C. This eliminates the effects of a demagnetizing factor. This aspect reduces the coercivity requirement for the permanent magnet that provides the static field. Some of the main benefits of this magnetic/extensional stress annealing design are lower cost, high safety, and delivery of high magnetic fields. See FIG. 10.

While example embodiments have been particularly shown and described, it will be understood by those skilled in the art that the sealed sample tube contained within the vertical tube furnace can be scaled up in size and various changes in form and details may be made therein without departing from the scope of contemplated embodiments.

Ttetratenite was produced by starting with nominally equiatomic alloys of FeNiX, with X=2 at % Mo, Ir or Nb, and processing these alloys by cold rolling the polycrystalline ingots into strips of sizes 11.8 cm×1.2 cm for FeNiMo, 8.8 cm×1.2 cm for FeNiIr, and 6.2 cm×1.1 cm for FeNiNb. Other geometries, sizes and dimensions of severely-deformed starting alloy samples may be contemplated. The final thicknesses of these samples after cold-rolling along with their corresponding cold work levels were as follows: 0.2921 mm with-93% cold work for FeNiMo; 0.2794 mm with-93% cold work for FeNiIr; and 0.3048 mm with-86% for FeNiNb. Prior to the multi-driver extensional stress, magnetic, atmospheric, and heat treatment, the samples were cut into the smaller sizes to preserve a part of the samples in as-cold-rolled state for characterization, including the control samples which were heat treated under extensional stress but in the absence of any external applied magnetic fields. FeNiMo and FeNiIr were simultaneously heat treated in the first run and FeNiNb was heat treated in a second run. The size of the samples which were heat treated in the presence of external magnetic and extensional stress fields are: 6.0 cm×1.2 cm for FeNiMo and FeNiIr, and 4.5 cm×1.1 cm for FeNiNb.

The vertical tube furnace, with internal sample tube, was utilized to apply multidriver conditions to accelerate the formation of tetratenite. Each sample strip was perforated at both ends to enable uniform extensional stress, derived from a static weight, to be applied to the samples. Samples were vertically suspended in the multidriver furnace from a hook which was welded in the inner side of the top flange of the furnace. A weight of −1.5 kg was suspended from the bottom side of the samples to apply an extensional stress to the samples. In this manner, an extensional stress of −4 MPa was supplied to the FeNiMo and FeNiIr samples, and an extensional stress of −8 MPa was supplied to the FeNiNb sample, subject to the heat treatments in the multidriver furnace.

The alloy strips were then attached to two SmCo magnets and a silicon steel flux return path to create a magnetic circuit. This arrangement, which provided a magnetic circuit, allows a static saturating magnetic field to be applied to the alloy strips. The rolling direction, the extensional stress and the magnetic field were all applied in the same direction to promote favorably oriented crystallographic and microstructural changes under these drivers.

After placing the samples in the sample tube within the vertical furnace, the furnace was closed and sealed. Using a roughing vacuum pump, the sealed furnace tube was pumped down to a final pressure of about 700 Torr. After this step, the vacuum pump was turned off and the samples were subject to a constant flow of gaseous $N_2$ with a flow rate of about 0.1 L/min, throughout the heat treatment cycles. The alloy strips, under simultaneous extensional stress and magnetic fields, were annealed in the following manner: Samples were heated with a heating rate of about 2 degrees/min to a temperature of T about 395° C., which is above the order-disorder temperature of tetratenite (TOD=320° C.). The samples were kept at this temperature for about 5 mins to stabilize temperature stability and uniformity throughout the samples. After this step, the samples were slowly cooled through the TOD to temperature of about 285° C., which is slightly below the TOD, with a cooling rate of about −0.1 degree/min. The samples were maintained at T about 285° C. for 48 days and then cooled to room temperature in the furnace. The temperature of the samples was monitored throughout the heat treatment, via a thermocouple wire which was placed closed to the center of the samples and an external thermal data logger.

Figure 5:
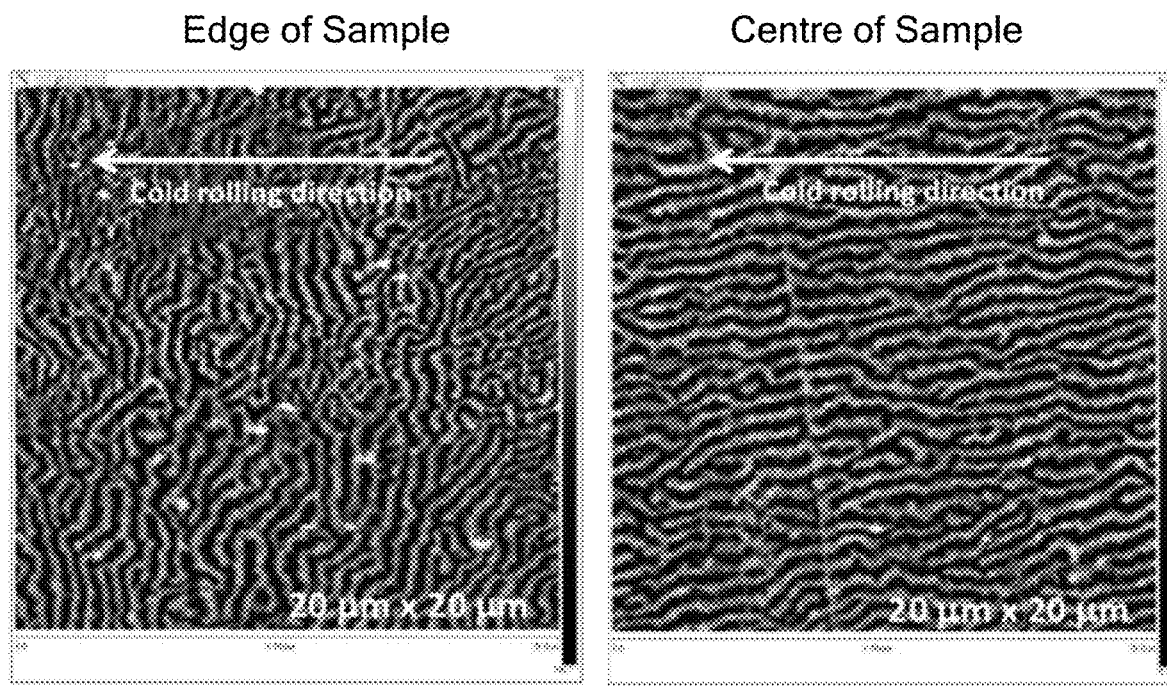
FIG. 5 shows magnetic force microscopy micrographs collected from FeNiX cold-rolled strip sample, sample subjected to multidriver annealing (simultaneous extensional stress, magnetic field and temperature) as described in the description. The direction of the original cold roll to form the strip is indicated by an arrow in each figure. The left image is taken from the long edge of the processed sample. The right image is taken from center top of the sample.
Figure 6:
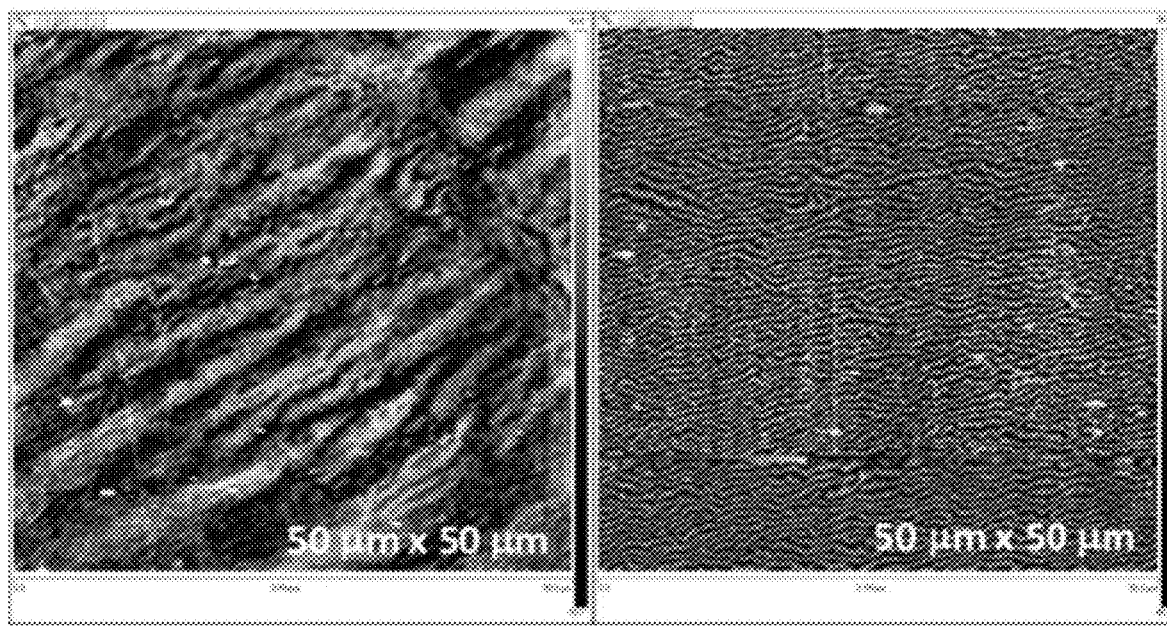
FIG. 6 shows magnetic force microscopy micrographs collected from the top surface of the processed FeNiX alloy. (Left) magnetic domain images of the cold-rolled strip sample, prior to multi-driver processing treatment described in the text. (Right) The same sample subjected to multidriver annealing (simultaneous extensional stress, magnetic fields and temperature) as described in text. The dramatic decrease of the magnetic domain size is consistent with a large increase of magnetocrystalline anisotropy produced upon multidriver processing.
Figure 7:
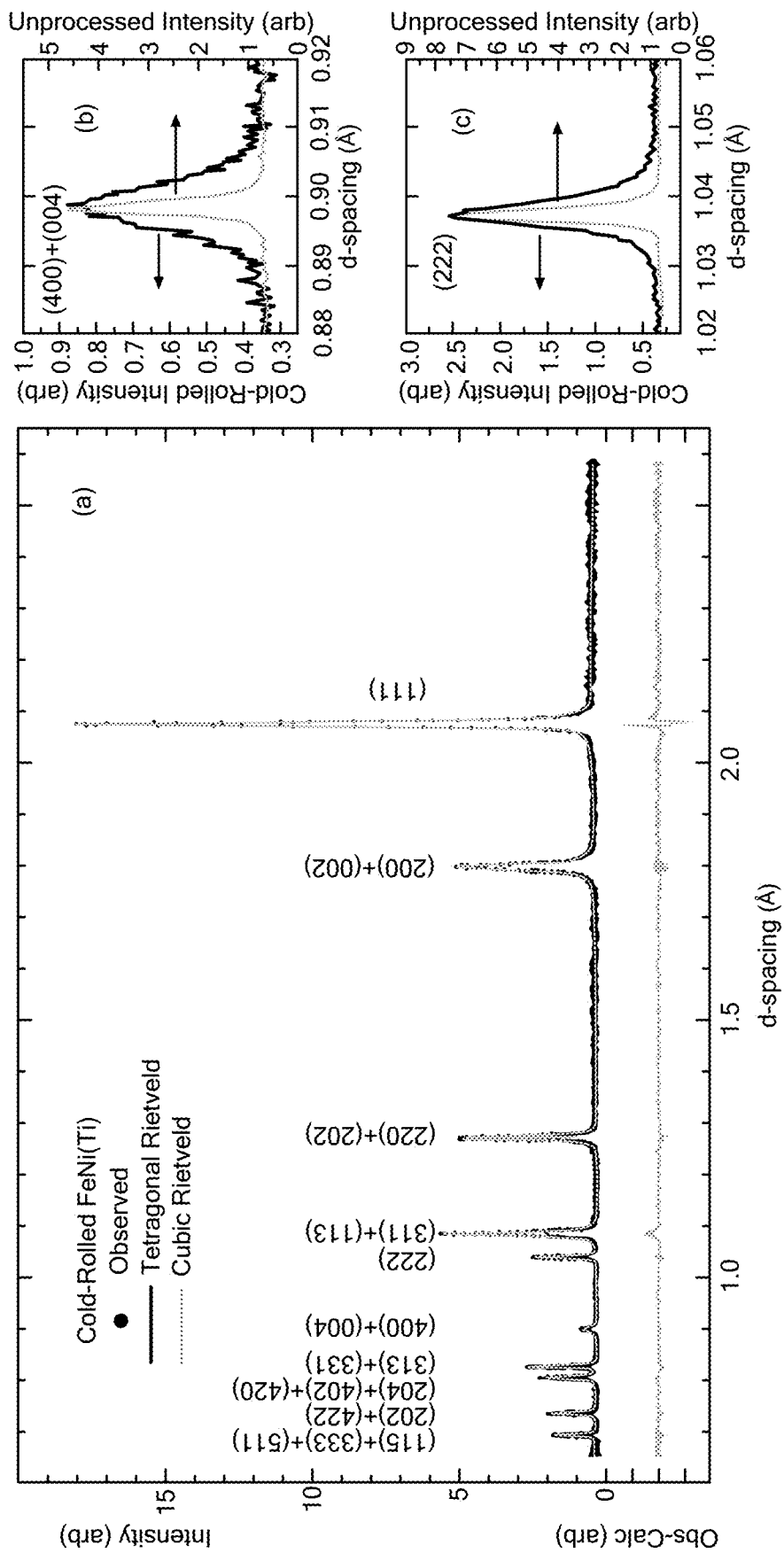
FIG. 7 shows the neutron diffraction pattern obtained for the cold-rolled annealed FeNi(Ti) sample. Panel (a). Observed data points (black) are displayed with the calculated tetragonal (darker gray) and cubic (lighter gray) Rietveld refinement fits overlaid. The Miller indices (hkl) of the Bragg peaks (for a C4/mmm representation of the $L1_0$ unit cell) are included for reference. Differences between the observed data and the calculated patterns are displayed in the traces located below the peaks. Panel (b). Detailed view of the (400) fundamental Bragg peak data observed from cold-rolled annealed FeNi(Ti) in both the unprocessed (red trace) and processed (black trace) states that illustrate processing-induced broadening of this peak, consistent with symmetry lowering. Panel (c). Detailed view of the (222) fundamental Bragg peak derived from cold-rolled annealed FeNi(Ti) in both the unprocessed (red trace) and processed (black trace) states that emphasize processing induced broadening of this peak.

After the multi-driver annealing process, samples were cut from the strips and mounted for metallographic polishing. A planar surface, as well as two orthogonal surfaces of each sample were cut out, mounted and polished for further analysis. As a diagnostic characterization technique, the magnetic domain patterns of the pieces were probed with room-temperature magnetic force microscopy, with representative images displayed in FIG. 5. The magnetic domain images shown in FIG. 5 are consistent with the presence in the processed (multidriver furnace) alloy of uniaxial magnetocrystalline anisotropy, with largely in-plane magnetization present on the top surface of the strip, and out-of-plane magnetization/anisotropy on the edges of the strip. The small domain size observed in the multidriver furnace-processed alloys is consistent with the presence of a large magnetocrystalline anisotropy. A large increase in magnetocrystalline anisotropy upon subjecting the cold-rolled starting alloy to the multi-driver processing treatment (annealing under simultaneous application of extensional stress and magnetic field) may be deduced from the magnetic domain images of FIG. 6, where a very large decrease in magnetic domain size is noted upon multidriver processing. Tetratenite material produced with methods of the invention can be used in motors, generators, hybrid vehicle power trains, accessory motors, energy harvesting equipment, novelty magnets, office and consumer hardware, and the like.

This application claims the priority of U.S. Provisional Application No. 62/547,279 filed on 18 Aug. 2017 and entitled "METHOD OF TETRATENITE PRODUCTION", which is hereby incorporated by reference.

What is claimed is:

1. A method of making a magnetic FeNi alloy material containing $L1_0$ ordered structure, the method comprising the steps of:
   (a) preparing a melt comprising Fe, Ni, and optionally one or more elements selected from the group consisting of Ti, V, Al, B, C, Mo, Ir, and Nb, wherein the atomic ratio of elements in the melt is according to the formula $Fe_{(0.5-a)}Ni_{(0.5-b)}X_{(a+b)}$, wherein X is Ti, V, Al, B, C, Mo, Ir, or Nb, and wherein $0 \le (a+b) \le 0.1$;
   (b) cooling the melt to yield a solid form of an FeNi alloy material;
   (c) subjecting the solid form to a severe plastic deformation process comprising deforming the solid form in a longitudinal direction, wherein the severe plastic deformation process is performed at a first temperature, below a chemical ordering temperature of said $L1_0$ phase, to yield a deformed solid form of said FeNi alloy;
   (d) applying an extensional stress to the deformed solid form along said longitudinal direction;
   (e) applying a magnetic field to the deformed solid form along said longitudinal direction;
   (f) heating the deformed solid form in a reduced oxygen environment to a second temperature, above said chemical ordering temperature, to form a transitional tetragonal disordered phase; and
   (g) cooling the solid form from said second temperature to a third temperature, below said chemical ordering temperature, whereby the magnetic FeNi alloy material containing $L1_0$ ordered structure is obtained.

2. The method of claim 1, wherein step (d) and/or step (e) is performed during at least part of the time while performing step (g).

3. The method of claim 2, wherein steps (d) and (e) are performed simultaneously, sequentially, or intermittently at least part of the time while performing step (g).

4. The method of claim 1, wherein step (g) comprises cooling the solid form from said second temperature at a rate of about 0.01° C./minute to about 1° C./minute.

5. The method of claim 1, wherein the third temperature is from about 50% to about 90% of said chemical ordering temperature.

6. The method of claim 1, wherein the third temperature is from about 2° C. to about 20° C. below said chemical ordering temperature.

7. The method of claim 1, wherein the severe plastic deformation comprises cold rolling performed at a temperature in the range from about 310° K to about 600° K.

8. The method of claim 1, wherein the extensional stress applied in step (d) is in the range from about 1 MPa to about 60 MPa.

9. The method of claim 1, wherein the extensional stress is applied in a downward direction by attaching a weight or a tensioned clamp to a lower portion of the deformed solid form.

10. The method of claim 1, wherein the magnetic field applied in step (e) has a magnitude in the range from 0.5 T to 10 T.

11. The method of claim 1, wherein the magnetic field applied in step (e) is applied using a closed loop produced by attaching permanent magnets to the deformed solid form and providing a flux return path.

12. The method of claim 11, wherein the flux return path establishes flux lines through the deformed solid form in said longitudinal direction.

13. The method of claim 1, wherein step (g) comprises holding the deformed solid form at the third temperature for a period of time in the range from about 4 hours to about one year.

14. The method claim 1, wherein at least 50% by weight of the magnetic FeNi alloy material is in the form of $L1_0$ ordered structure.

15. The method of claim 1, wherein at least 90% by weight of the magnetic FeNi alloy material is in the form of $L1_0$ ordered structure.

16. The method of claim 1, wherein the magnetic FeNi alloy material is nanoparticulate.

17. The method of claim 1, wherein the magnetic FeNi alloy material is a bulk material.

18. The method of claim 1, wherein in step (b) the melt is cooled below the chemical ordering temperature of said $L1_0$ phase, and wherein the solid form in step (b) comprises disordered face-centered cubic unit cells.

19. The method of claim 1, wherein in step (f) the transitional tetragonal disordered phase comprises A6-type unit cells, and whereby in step (g) the $L1_0$ ordered structure is obtained by a phase-transition of the transitional tetragonal disordered phase to the $L1_0$ ordered structure.

* * * * *